United States Patent [19]

Schweitzer, Jr.

[11] 4,456,873
[45] Jun. 26, 1984

[54] CABLE MOUNTED MAGNETIC CORE ASSEMBLY

[76] Inventor: Edmund O. Schweitzer, Jr., 1002 Dundee Rd., Northbrook, Ill. 60118

[21] Appl. No.: 289,916

[22] Filed: Aug. 4, 1981

[51] Int. Cl.³ .................. G01R 31/02; G01R 1/20; H01F 17/06
[52] U.S. Cl. .................. 324/51; 324/127; 336/176
[58] Field of Search .................. 324/127, 51, 133; 336/20, 175, 176

[56] References Cited

U.S. PATENT DOCUMENTS

| 2,779,927 | 1/1957 | Rudge | 324/127 |
| 3,434,052 | 3/1969 | Fechant | 324/127 |
| 3,725,832 | 4/1973 | Schweitzer, Jr. | 336/176 |

FOREIGN PATENT DOCUMENTS

| 991779 | 10/1951 | France | 324/127 |
| 174259 | 10/1965 | U.S.S.R. | 324/127 |

Primary Examiner—Ernest F. Karlsen
Attorney, Agent, or Firm—Lockwood, Dewey, Alex & Cummings

[57] ABSTRACT

A fault indicator for indicating the occurrence of a fault current in an electrical conductor includes a core assembly which attaches a circuit module to a monitored conductor and provides a concentrated magnetic flux indicative of the current level in the conductor. A magnetic reed switch in the circuit module responds to the magnetic flux in the core assembly to condition an indicator in a remote indicator module to a fault-indicating state in the event of a fault. To facilitate installation and removal of the circuit module from the conductor, the core assembly is formed by a plurality of laminations secured together and arranged in a generally rectangular configuration with their ends juxtaposed along one side thereof and joined with magnetically conductive interlocking coupling members. A spring spanning the remaining opposed sides of the core biases the coupling members into engagement and allows the structure to be fitted over conductors of various sizes, while maintaining a close operative association between the conductor and the magnetic reed switch in the circuit module.

32 Claims, 21 Drawing Figures

CABLE MOUNTED MAGNETIC CORE ASSEMBLY

BACKGROUND OF THE INVENTION

The present invention relates generally to current sensing devices for electrical systems, and more particularly to current reset fault indicators and magnetic core assemblies for use therein.

Detection of fault currents in power distribution cables, such as those used in underground electrical distribution systems, is often most readily accomplished by means of automatically-reset clamp-on type fault indicators, which are attached to the cable being monitored and include a reed switch or other magnetically-actuated means in magnetic communication with the monitored conductor to condition an indicator to a fault-indicating state upon the occurrence of a fault current, and a reset circuit for returning the indicator to a reset-indicating condition upon restoration of line current. Examples of automatically reset fault indicators are found in U.S. Pat. Nos. 3,676,740, 3,906,477, 4,086,529, and 4,234,847 of the present inventor.

Automatically-reset clamp-on type fault indicators typically derive their operating power directly from current flow in the monitored conductor. In such current-reset fault indicators a magnetic core assembly is generally required to provide a concentrated magnetic flux from current flow through the conductor. A magnetic winding in magnetic association with the core assembly converts the concentrated flux to an electric current which is rectified for use in powering the fault indicator.

For optimum flux pick-up it is desirable that the magnetic core assembly be in the form of a closed loop which completely encircles the conductor. However, to enable the core assembly to be installed and removed from the conductor, it is necessary that connection means be provided by which the loop can be opened. One form of magnetic core assembly which has proved particularly successful in this regard is described in U.S. Pat. No. 3,725,832, which issued to the present inventor on Apr. 3, 1973. In this construction a circular magnetic core is provided which comprises a plurality of laminations of pre-stressed oriented silicon steel secured together near their juxtaposed ends so as to form an annular loop around a monitored conductor. The ends are provided with interlocking tongue-and-groove type members formed of corrosion resistant magnetic material which allow the loop to be opened for installation and removal on a conductor. The present invention constitutes an improvement in this form of assembly.

One requirement of closed loop magnetic core current-reset fault indicators having magnetic sensing means such as a reed switch or magnetic sensing coil for fault detection is that adequate coupling be maintained between the magnetic sensing means and the monitored conductor when the fault indicator is installed on cables of different diameters. Because of safety considerations it is usually not practical to tie or otherwise secure smaller diameter cables to the core assembly so as to deliberately position the cables adjacent the magnetic reed switch. The present invention obviates this problem by providing a construction whereby the monitored cable is always maintained in close proximity to the magnetic sensing means of the fault indicator, notwithstanding variations in cable diameter.

A further drawback of prior art closed loop magnetic core assemblies has been their susceptibility to being inadvertently pulled off the monitored conductor, as when force is exerted on leads connected to the circuit module. The present invention overcomes this problem by providing a positive spring-biased locking engagement in the closed loop core assembly whereby forces exerted on connecting leads only serve to more securely lock the core assembly in place and removal is possible only by deliberate manipulation of the core assembly by the use of lineman's tools or other appropriate means.

Accordingly, it is a general object of the present invention to provide a new and improved current-reset clamp-on type fault indicator.

It is a more specific object of the present invention to provide a new and improved current-reset clamp-on type fault indicator having an improved magnetic core assembly.

It is another object of the present invention to provide a clamp-on type fault indicator which is readily adaptable to a wide range of cable diameters.

It is another object of the present invention to provide a clamp-on type fault indicator which is less susceptible to being inadvertently pulled free of the monitored cable.

It is another general object of the present invention to provide a new and improved magnetic core assembly for use in fault indicators and the like.

SUMMARY OF THE INVENTION

A removable magnetic core assembly for installation on an electrical conductor includes a plurality of elongated strips of resilient magnetic material arranged side-by-side and joined at the ends thereof to form a magnetic core. The core is formed into a closed loop and has a first side opposite a second side, and a third side joining the first and second sides, and is dimensioned to receive the electrical conductor within the closed loop. Interlocking connection means disposed along the third side of the core establish a separable magnetic connection in the closed loop, the connection being locked against lateral displacement upon the connection members being urged into axial engagement. Biasing means comprising a spring member extending between the first side and the second sides of the core and on the opposite side of the conductor from the third side of the core draw the first and second sides together whereby the connection means is urged into axial engagement and the conductor is urged into contact with the third side of the core.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
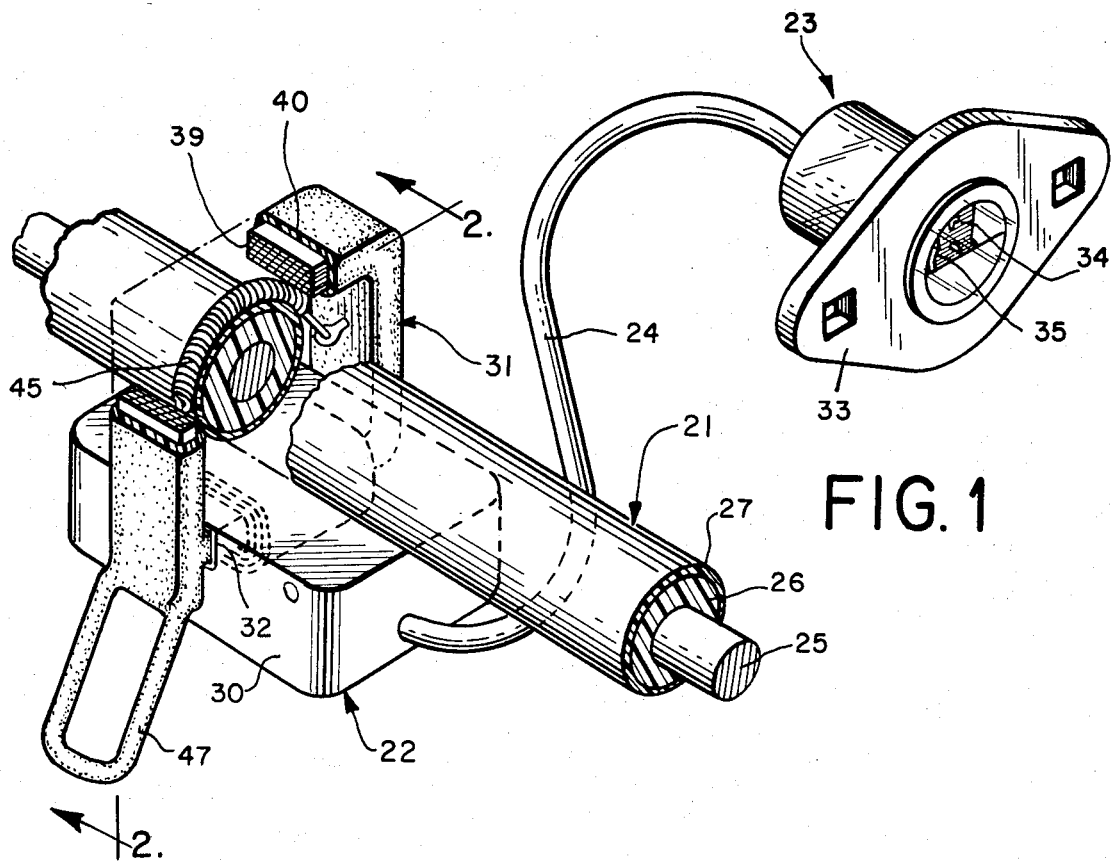
FIG. 1 is a perspective view partially in section of a current-reset clamp-on type fault indicator system constructed in accordance with the invention.

Referring to the Figures, and particularly to FIG. 1, a clamp-on current-reset fault indicator system 20 constructed in accordance with the invention for indicating fault currents in an electrical feeder or distribution cable 21 is seen to include a circuit module 22 and a remote indicator module 23. The circuit module 22 is connected to the indicator module 23 by an insulated multiple conductor electrical cable 24. In accordance with conventional practice, the circuit module is attached to the outer surface of cable 21, which may include a central conductor 25, a concentric insulating layer 26, and an electrically-grounded rubber outer sheath 27.

Basically, circuit module 22 includes a circuit housing 30 within which circuitry for sensing fault currents and actuating indicator module 23 is contained, and a magnetic core assembly 31 for attaching the module to a monitored conductor such as cable 21 and for deriving the necessary magnetic flux in sufficient concentration for powering the circuitry of the circuit module. The core assembly is preferably formed as a closed loop of generally rectangular configuration so as to completely encircle cable 21, and includes connection 32 means by which the core can be opened to facilitate installation on or removal from a monitored conductor.

The remote indicator module 23, which may be mounted by means of flange portions 33 on the side of an enclosure or on a control panel, includes in accordance with conventional practice a status-indicating flag 34 for indicating circuit status. The flag 34 may be viewed through a window 35 at the front of the indicator module.

In operation, during normal current flow in conductor 21, indicator flag 34 is positioned by circuitry in circuit module 22 so as to present a white or reset condition-indicating surface to the viewer. Upon the occurrence of a fault current in the conductor, the indicator flag is repositioned by the circuitry so as to present a red or fault-indicator surface to the viewer.

Figure 2:
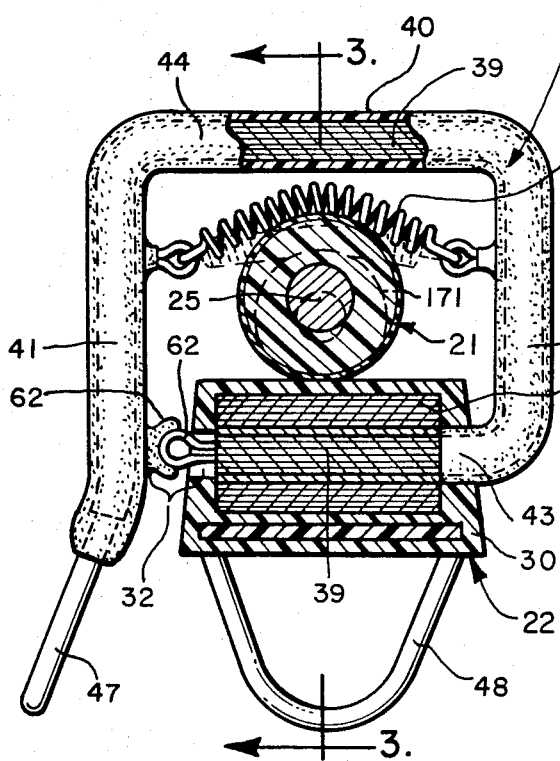
FIG. 2 is an enlarged cross-sectional view of the circuit module of the fault indicator taken along line 2—2 of FIG. 1.

Referring to FIG. 2, the core assembly 31 of circuit module 22 is seen to consist of a plurality of individual strips or laminations 39 formed of oriented silicon steel arranged side-by-side in a generally rectangular closed-loop configuration. The core assembly is preferably encapsulated in a layer 40 of resin epoxy insulating material. As best seen in FIG. 2, the rectangular configuration includes a generally rectilinear first or left side portion 41, a generally rectilinear second or right side portion 42 opposed to first portion 41, a generally rectilinear third or bottom portion 43, and a generally rectilinear fourth or top portion 44 opposed to third portion 43. The closed loop consisting of side portions 41-44 includes connection point 32 at the junction of the first or left side portion 41 and the third or bottom portion 43.

In accordance with the invention, the first or left side portion 41 is drawn toward the second or right side portion 42 of the core assembly by biasing means in the form of a helical spring 45 which extends between the two sides of the opposite side of conductor 21 from the third or bottom portion 43. A first manipulating ring 47 formed as an extension of left side member 41, and a second manipulating ring 48 formed as part of bottom member 43, facilitate opening the core assembly when installing or removing the circuit module.

Figure 3:
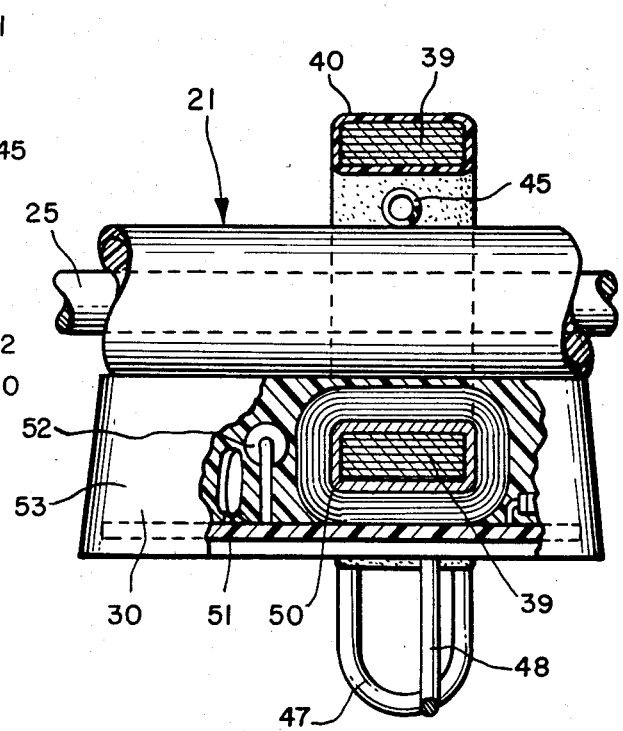
FIG. 3 is a cross-sectional view of the circuit module taken along line 3—3 of FIG. 2.

To provide operating power for the fault indicator system, circuit module 22 includes a magnetic winding 50 in operative association with magnetic cpore assembly 30. As seen in FIGS. 2 and 3, winding 50 is coaxially positioned on the third or bottom portion 43 of the core assembly and is dimensioned to provide a close fit with the core cross section. The winding is preferably attached to a circuit board 51 on which the other components of the circuit module are mounted. These components include a magnetic reed switch 52, which is positioned with its axis perpendicular to and spaced from the axis of conductor 21 so as to respond to fault currents in the conductor in a manner well known to the art. The entire assembly, consisting of winding 50, circuit board 51, magnetic reed switch 52 and the other components of the module, may be encapsulated in an epoxy material 53 so as to form within housing 30 at the bottom portion of core assembly 31 a weatherproof module responsive to the current level in conductor 21.

Figure 4:
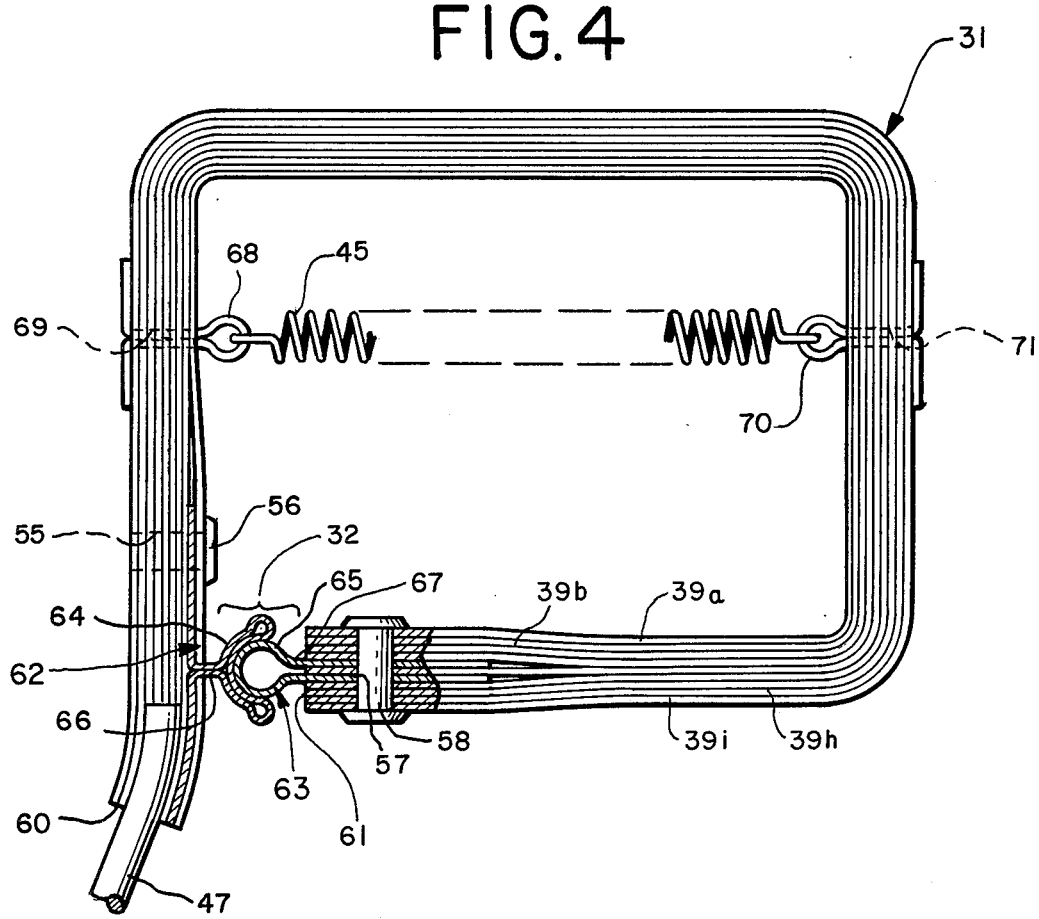
FIG. 4 is a cross-sectional view of the magnetic core assembly of the circuit module of FIGS. 1-3.

A preferred construction for the magnetic core assembly 31 is illustrated in FIG. 4. Here the core assembly is shown as formed of a plurality of strips or laminations 39a-39i of oriented silicon steel. Although for illustrative purposes nine such strips are shown, it will be understood that a lesser or greater number of strips or laminations may be employed as required by the particular application. Each strip or lamination includes a rivet opening 55 at one end for receiving a rivet 56, and a rivet opening 57 at its other end for receiving a rivet 58 for holding the ends together.

In constructing the magnetic core assembly 31 the strips or laminations 39 are cut with successively increasing lengths from a coil of oriented silicon steel having relatively inherent resiliency. After the laminations have been cut to the appropriate lengths the ends are pierced to provide the apertures 55 and 57 for rivets 56 and 58. The laminations are then assembled in the order of successively greater lengths outward, and are shaped to the required rectangular form by conventional shaping means, forming core end portions 60 and 61.

To provide a low reluctance magnetic connection between the ends of 60 and 61 of the core assembly, the core assembly preferably includes a pair of interlocking coupling members 62 and 63. As illustrated in FIG. 4, coupling member 62 includes a concave-cylindrical interlocking end portion 64 and coupling member 63 includes a convex-cylindrical interlocking end portion 65. These interlocking portions when mated as shown form a low reluctance magnetic connection. Stem portions 66 and 67 of coupling members 62 and 63, which include apertures for receiving rivets 56 and 58, respectively, provide saturable sections which limit the magnetic flux induced in the magnetic core assembly. This is of particular importance since the current flow in the conductor may be in the order of several thousand amperes under certain fault current conditions.

Preferably, coupling members 62 and 63 are formed of strips of corrosion-resistant metal such as relatively high permeability nickel iron. The dimensions of the interlocking concave and convex shaped portions are such as to provide a snap fit so that the air gap effect of the connection and vibration of the core as a result of 60 hertz energization is minimized.

To assist in maintaining the coupling members in engagement, the core structure includes a helical spring 45. One side of this spring is secured to the first or left side portion 41 by a wire clip 68, which includes an eyelet portion for engaging the hooked end of the spring, and a stem portion which extends through appropriately dimensioned apertures 69 in the laminations and is bent over in opposite directions against the outermost lamination 39i to prevent the clip from being pulled out. Similarly, the other hooked end of spring 55 engages the eyelet portion of a second wire clip 70. Like clip 68, this clip includes a stem portion which extends through appropriately dimensioned apertures 71 in the laminations and is bent over in opposite directions against the outermost lamination 39i to prevent the clip from being pulled out. Other forms of clips may be used for this purpose, including clips which encircle the laminations and do not require an aperture for mounting purposes.

As a result of spring 55, the opposite side walls of the core assembly are drawn together and coupling members 45 and 46 are maintained in tight interlocking engagement. An additional advantage of spring 55 is that the cable 21 to which the core assembly is attached is caused to bear against the third or bottom portion 43 of the core assembly, notwithstanding a wide variation in cable diameters. This provides for a more secure attachment, and for a better magnetic coupling between magnetic reed switch 52 and the monitored conductor.

Figures 5A, 5B, 5C:
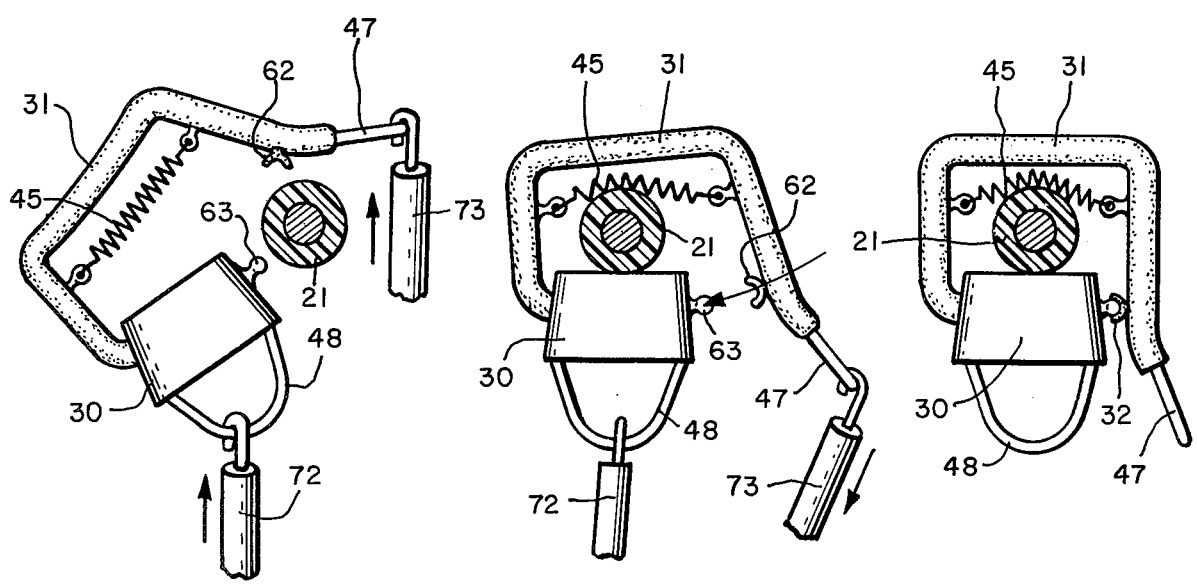
FIG. 5a is a side elevational view of the circuit module showing the magnetic core assembly thereof opened for installation on a conductor.
FIG. 5b is a view similar to FIG. 5a showing the magnetic core assembly in the process of being installed on a conductor.
FIG. 5c is a view similar to FIG. 5a showing the magnetic core assembly installed on an electrical conductor.

The method of installation of a circuit module incorporating the magnetic core assembly 31 on a monitored electrical cable 21 is illustrated in FIGS. 5A-5C. Referring to FIG. 5A, installation is most readily accomplished by use of a pair of conventional hot sticks or lineman's tools 72 and 73. Hot stick 72 is first engaged to ring 48 in a conventional manner and the core assembly is positioned adjacent the monitored conductor 21. Then, from the other side of the conductor, the second hot stick 73 is engaged to ring 47. Holding hot stick 72 steady, hot stick 73 is pushed upwardly to open the structure, as shown in FIG. 5A. Then, using both hot sticks, the core structure is moved over conductor 21. Holding ring portion 48 steady using hot stick 72, the core structure 31 is now closed by drawing hot stick 73 downwardly so as to engage coupling members 62 and 63 at connection point 32, as shown in FIG. 5B. Once engaged, as shown in FIG. 5C, the circuit module is firmly attached in close magnetic communication with the monitored cable.

Figure 6:
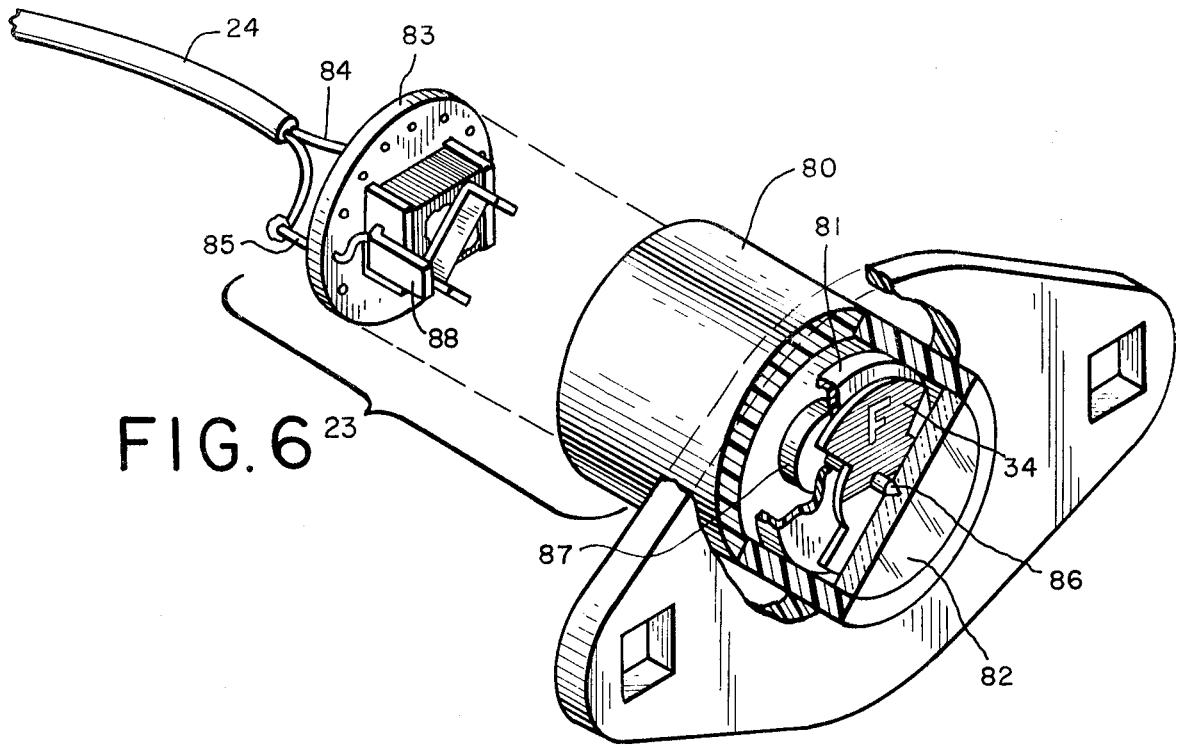
FIG. 6 is an exploded perspective view of the indicator module of the fault indicator system of FIG. 1.

Referring to FIG. 6, indicator module 23, which may be conventional in structure and operation, includes a cylindrical transparent plastic housing 80 within which the components of the module are contained. Within housing 80 an integral partition 81 serves as a mask and spacing element, and a transparent end cap 82 sonically welded to the end of the housing seals the interior against contamination while providing the viewing window 35 (FIG. 1).

A disc-shaped circuit board 83 is positioned perpendicularly to the axis of the housing. This circuit board, which may be secured in position by an epoxy material filling the rear portion of the housing, serves as mounting means for the components of the indicator module. An electrical connection is established between the indicator module 23 and the circuit module 22 by cable 24, which comprises a pair of conductors 84 and 85.

To provide an indication of the occurrence of a fault current, the indicator module includes within the lower end of housing 80 the disc-shaped target indicator 34 mounted for rotation about a pivot point 86. As best seen in FIGS. 8-10, the face of target indicator 34 has a red segment 34a and a white segment 34b, only one of which is visible at a time through window 35 in the transparent end of housing 80.

Secured to and pivotal with target disc 34 is a target permanent magnet 87, which is formed of a magnetic material having a high coercive force, such as ceramic, and is magnetically polarized to form two magnetic poles of opposite polarity, as indicated in FIGS. 8-10, with opposite magnetic polarities along a diameter of the magnet.

Figure 8A:
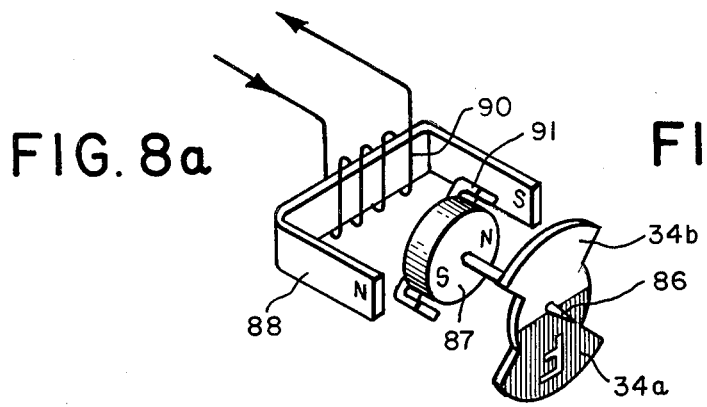
FIGS. 8a and 8b are diagrammatic perspective and front elevational views of the principal components of the indicator module of FIG. 6 in a reset state.
Figure 8B:
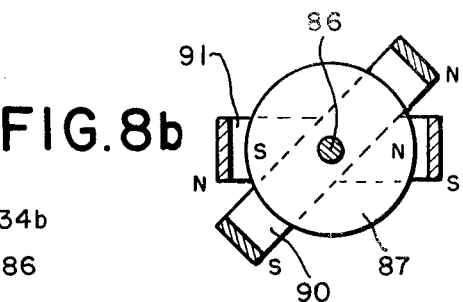

Pole piece 88, which is preferably formed of a magnetic magerial having a relatively low coercive force, such as a chrome steel, in a reset condition is biased at its projecting ends to the magnetic polarities indicated in FIGS. 8a and 8b. As shown in FIG. 6, the ends of the pole piece extend along the side wall of housing 80, in close proximity to garget magnet 87. As a result, the opposite polarity magnetic poles of the target magnet 87 are attracted to position the target disc 34 to the reset or non-tripped position shown. In this position the red segment 34a of the target disc is not visible through window 35, and all that is seen is the white segment 34b.

Figure 9A:
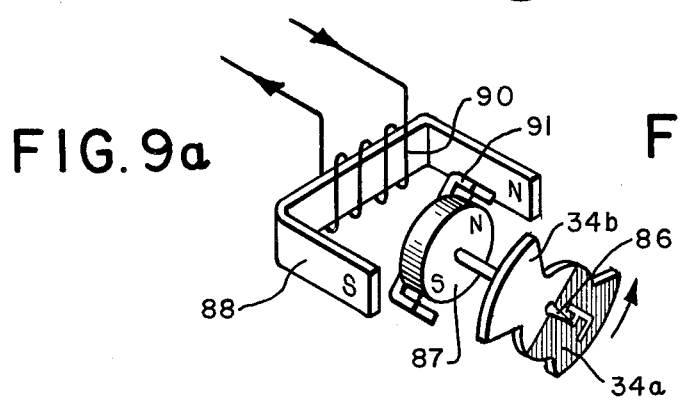
FIGS. 9a and 9b are diagrammatic views similar to FIGS. 8a and 8b showing the principal components of the indicator module of FIG. 6 in transistion to a fault-indicating state.
Figure 9B:
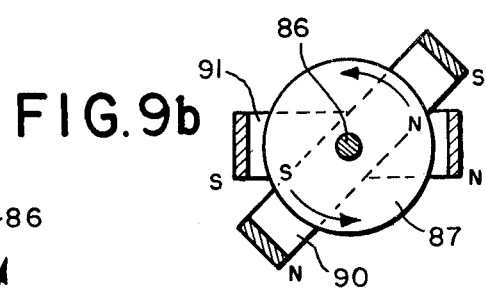
Figure 10A:
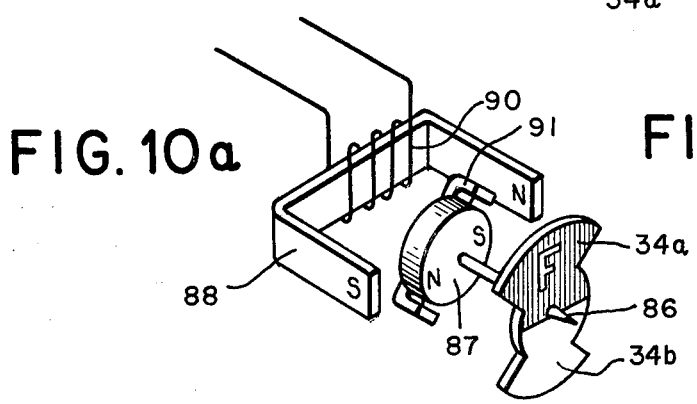
FIGS. 10a and 10b are diagrammatic views similar to FIGS. 8a and 8b showing the principal components of the indicator module of FIG. 6 in a fault-indicating state.
Figure 10B:
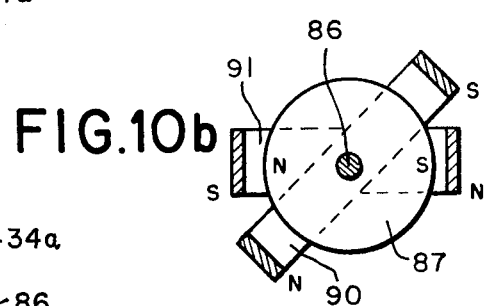

On the occurrence of a fault current in conductor 21, pole piece 88 is remagnetized to the magnetic polarities shown in FIGS. 9 and 10 by momentary energization in one direction of a winding 90 on the center section of the pole piece. As a result, the poles of magnet 87 are repelled by the adjacent like-polarity poles of the pole piece and target disc 34 is caused to rotate 180° to the tripped position shown in FIGS. 10a and 10b. In this position, the red segment 34a of the target disc is visible through window 35, and a lineman viewing the fault indicator is advised that a fault current has occurred in conductor 21.

The target disc 34 remains in the fault indicating position until the ends of pole piece 88 are subsequently remagnetized to the magnetic polarities shown in FIGS. 8a and 8b by momentary energization of winding 90 with a current in the opposite direction. Upon this happening, target magnet 87, and hence target disc 34, is caused to rotate from the tripped position shown in FIGS. 10a and 10b to reset position shown in FIGS. 8a and 8b, and the fault indicator is conditioned to respond to a subsequent fault current.

To preclude target disc 34 from becoming stalled upon reversal of the magnetic polarities of pole piece 88, as might happen with a target perfectly centered between the poles of the pole piece and having a degree of bearing friction, the fault indicator includes an auxiliary U-shaped pole piece 91 positioned adjacent target magnet 87 coaxial with and at an angle to pole piece 88. The existence of a magnetic field between the poles of pole piece 88 results in the production of induced magnetic poles of auxiliary pole piece 91. As a result, upon reversal of the magnetic polarity of the poles of pole piece 88 following occurrence of a fault current the auxiliary poles exert a rotational force on the most adjacent poles of the target magnet 87. This causes a rotational moment to be exerted on target disc 34, tending to turn the target in a predetermined (counter-clockwise in FIGS. 8–10) direction such that the target is precluded from remaining in its reset position, even if it should be perfectly positioned and have a degree of bearing friction. Once rotation has been established, as shown in FIGS. 9a and 9b, the greater force of the main pole piece 88 overcomes the effect of the auxiliary pole piece 91 and rotation continues until the target is aligned as shown in FIGS. 10a and 10b.

Figure 7:
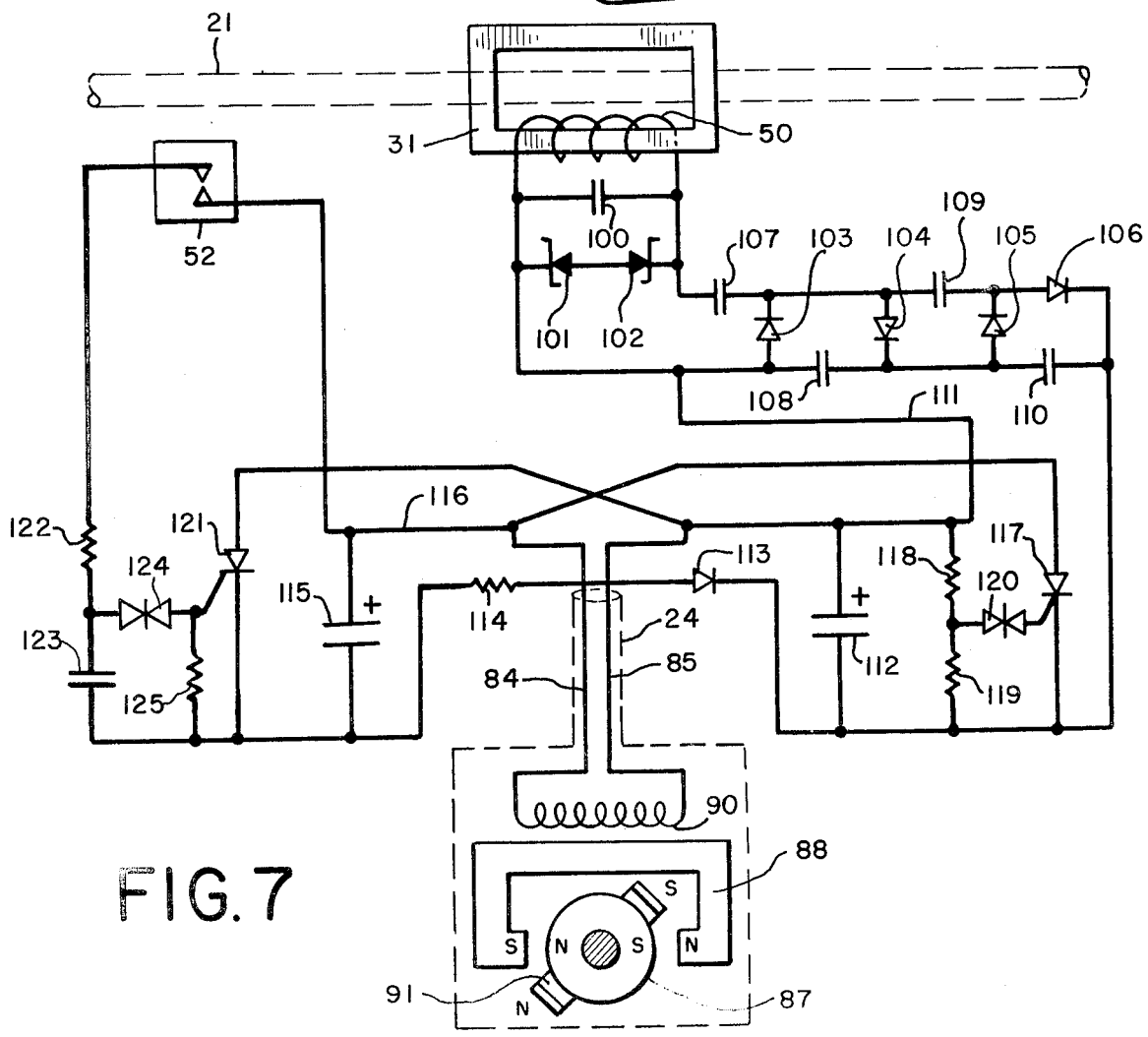
FIG. 7 is an electrical schematic diagram of the fault indicator system of FIG. 1.

Energization of winding 90 by current in one direction upon occurrence of a fault current in conductor 21, and energization of winding 90 by current in the opposite direction upon restoration of current in conductor 21, is accomplished by means of circuitry contained within circuit module 22. Referring to the schematic diagram shown in FIG. 7, the single winding 90 of indicator module 23 is connected to the circuit module by conductors 84 and 85 of cable 24.

Power for operation of the circuit module is obtained from pick-up winding 50, within which an alternating current is induced in a manner well known to the art as a consequence of the alternating current in conductor 21. Winding 50 is tuned to resonance at the power line frequency by a capacitor 100 and the resultant resonant output signal is peak-limited by a pair of zener diodes 101 and 102 connected back-to-back across the winding.

The resonant signal is increased in voltage by a conventional voltage multiplier circuit comprising diodes 103-106 and capacitors 107-110 to develop in a manner well known to the art a direct current of sufficient magnitude for powering the circuitry of the module.

The positive polarity output terminal of the voltage multiplier network, formed at the juncture of diodes 103 and capacitor 108, is connected to one terminal of winding 90 through a conductor 111, and to one terminal of a first current storage capacitor 112. The negative polarity output terminal of the voltage multiplier network, formed at the juncture of diodes 106 and capacitor 110, is connected to the remaining terminal of capacitor 112, and through a forward-biased diode 113 and a current limiting resistor 114 to one terminal of a second current storage capacitor 115. The other terminal of capacitor 115 is connected to the remaining terminal of winding 90 through a conductor 116. With this arrangement, capacitor 112 is charged directly, and capacitor 115 is charged through winding 90, by the unidirectional current developed by the voltage multiplier network during normal current flow in conductor 21.

To provide for periodic energization of winding 90 during normal current flow in conductor 21, the remaining end terminal of winding 90 is connected through a first switch device in the form of a silicon controlled rectifier (SCR) 117 to the negative polarity terminal of capacitor 112. Periodic conduction through SCR 117 is obtained by connecting the gate electrode of that device to the positive polarity output terminal of the voltage multiplier network through a voltage divider network comprising a pair of resistors 118 and 119 and a bilateral diode 120. SCR 117 is periodically triggered into conduction when the voltage developed across bilateral diode 120 as a result of capacitor 112 being charged by the voltage multiplier network reaches the threshold level of the diode. This causes a current flow in a first direction in winding 90, with the result that indicator disc 34 is positioned as shown in FIGS. 8a and 8b. Diode 113 prevents capacitor 115 from being discharged through SCR 117 upon conduction of that device, leaving the capacitor available for energizing winding 90 in a reverse direction in response to a fault condition.

Winding 90 is energized in the reverse direction upon occurrence of a fault current in conductor 21 by discharge of capacitor 115 through a second SCR 121 having its cathode connected to the negative polarity terminal of the capacitor, and its anode connected to the first end terminal of winding 90. Conduction is established through SCR 121 by closure of the contacts of reed switch 52, which is connected between the positive polarity terminal of capacitor 115 and the gate electrode of SCR 121 by a network comprising a resistor 122 and a capacitor 123, a bilateral diode 124, and a resistor 125.

Reed switch 52 is positioned within housing 30 in sufficiently close proximity to conductor 21 such that the contacts of the switch close upon occurrence of a fault current in the conductor. Upon this occurrence, the positive polarity terminal of capacitor 115 is connected through the closed contacts of reed switch 52 and the circuit comprising resistors 122 and 125, bilateral diode 124, and capacitor 123 to the gate electrode of SCR 121, causing that device to be rendered conductive. This causes capacitor 115 to discharge through the SCR, energizing winding 90 in the reverse direction and repositioning target disc 34 as shown in FIGS. 10a and 10b.

To preclude the possibility of currents of opposite direction being applied to winding 90 by simultaneous conduction of SCR 121 and SCR 117, a predetermined time delay in conduction through SCR 121 may be provided following occurrence of a fault current in conductor 21. This is accomplished by resistor 122 and capacitor 123, which together form an RC time constant network in the gate circuit of SCR 121. Upon closure of the contacts of reed switch 52 it is necessary that capacitor 123 charge through resistor 122 to the threshold voltage of bilateral diode 124 before sufficient gate electrode current is supplied to SCR 121 to initiate conduction in that device. Resistor 125 serves in a conventional manner as a current drain path for the gate electrode.

The time delay provided is designed to insure that should a fault occur simultaneously with the periodic energization of winding 90 in a reset direction, capacitor 112 will have completely discharged prior to winding 90 being energized to signal the fault.

Figure 11:
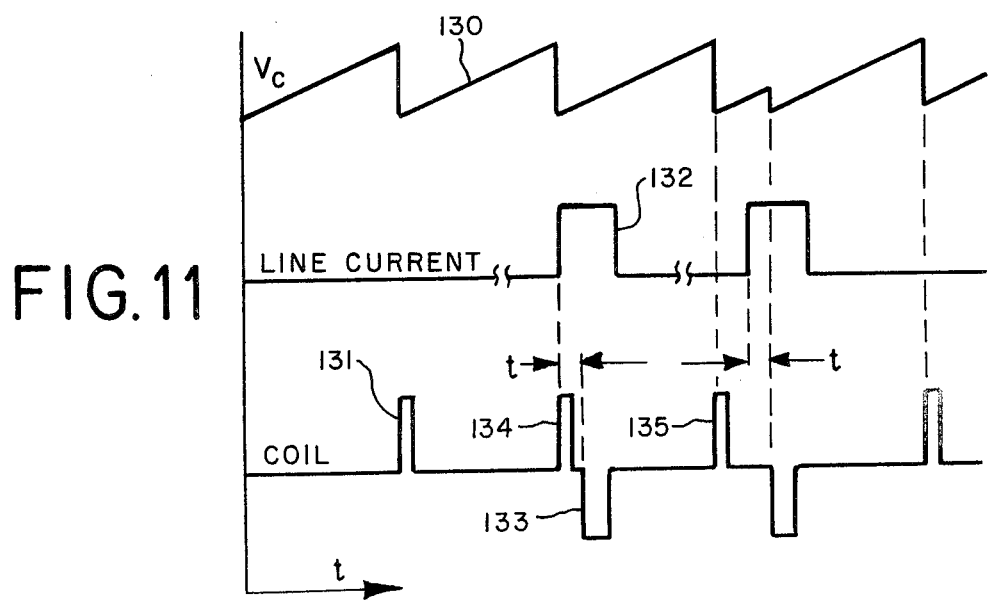
FIG. 11 is a depiction of certain waveforms useful in understanding the operation of the fault indicator system of FIG. 1.

The time delay relationship can be seen by referring to the waveforms illustrated in FIG. 11. Under normal line current conditions it is seen that the voltage Vc developed across capacitor 112 as depicted by waveform 130 progressively increases until the threshold level of bilateral diode 120 is reached, at which time SCR 117 is rendered conductive and a reset current depicted by waveform 131 is caused to flow through winding 90. Upon occurrence of a fault current in conductor 21, as depicted by waveform 132, winding 90 is energized in the opposite direction after a delay period t, as shown by waveform 133. Should the fault current occur simultaneously with the reset pulse, as shown by reset waveform 134, capacitor 112 will have completely discharged in one direction through winding 90 prior to the winding being energized in the opposite direction by capacitor 115, as a result of the time delay period.

Should a fault occur before the reset pulse, as illustrated by waveform 135, the then occurring reset cycle will be interrupted by discharge of capacitor 112 through diode 113, resistor 114, and SCR 121 so that no possibility exists of a reset pulse occurring simultaneously with the ensuing delayed fault pulse. Resistor 114 serves to limit current flow through diode 113 during this discharge period. Upon discharge of capacitors 112 and 115, the reset cycle begins anew and SCR 121 again becomes nonconductive.

Thus, in operation winding 90 is supplied with unidirectional current in one direction from a first current storage device, capacitor 112, and in an opposite direction from a second storage device, capacitor 115. Capacitor 112 is connected to one terminal of the magnetic winding, and capacitor 115 is connected to the other terminal. A first switch device, SCR 117, periodically completes the discharge circuit for capacitor 112 to the opposite terminal of the winding during reset conditions. A second switch device, SCR 121, completes the discharge circuit for capacitor 115 to the opposite terminal of the winding upon the occurrence of a fault current.

The two current storage capacitors 112 and 115 are simultaneously charged by a charging circuit which includes the line current-powered voltage multiplier network. Capacitor 112 is charged directly and capacitor 115 is charged through winding 90, isolation diode 113 and resistor 114. Diode 113 provides isolation for the trip circuit upon operation of the reset circuit.

Figure 12:
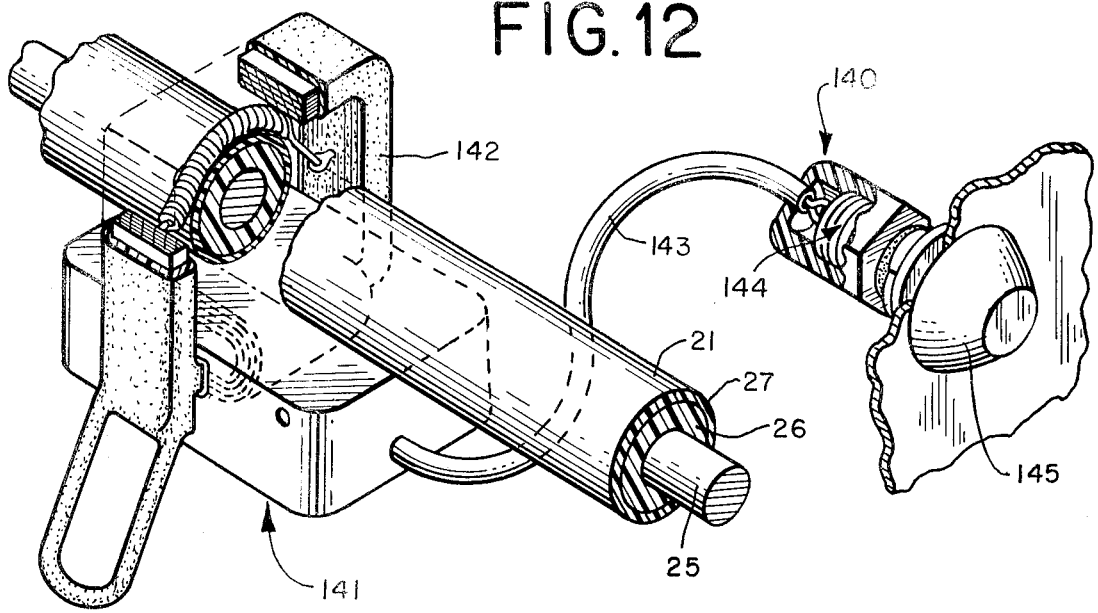
FIG. 12 is an alternative embodiment of the invention wherein a magnetic test point-type indicator module is employed.

The invention may also be incorporated in a fault indicator system of the type having a magnetic test point-type indicator module 140, and a circuit module 141, such as the system shown in FIG. 12. Basically, the circuit module 140 of this system is identical to the circuit module 20 previously described, and reference is made to the previous description of that module for the structure and operation of module 140. The circuit module 141 includes a magnetic core assembly 142 by which it is operatively and mechanically engaged to a monitored cable. The magnetic test point-type indicator module 140 is connected to circuit module 141 by a multiple conductor cable 143.

The remote magnetic indicator module 140 comprises a bolt-shaped housing 144 formed of an aluminum alloy having low magnetic resistance and retention characteristics. The housing includes a threaded shank portion which extends through an aperture in the wall of enclosure. A rounded head portion of relatively larger diameter on the exterior end of the body member forms the magnetic test point 145 of the indicator module and prevents the housing from being pulled back into the enclosure through the aperture. The shank portion of housing 144 includes a bore-shaped recess (not shown) which extends along essentially the entire length of the housing, but does not extend through the head portion 145.

To provide means for inducing a magnetic state at magnetic test point 145, indicator module 140 includes within the bore-shaped recess a magnetic winding assembly 146. This winding assembly includes a magnetic winding 147 wound on a generally cylindrical bobbin 147 formed of a non-conductive non-magnetic material such as plastic. The bobbin includes an annular flange portion 148 at its forward end, a pair of parallel-spaced annular flange portions 150 and 151 at its other end, and an axially-aligned bore-shaped recess (not shown). A rod-shaped magnetic core member 152 formed of a material having a high magnetic retention characteristic, such as $3\frac{1}{2}$ chrome magnet steel, is slidably received within the recess such that the forward end of the core member is brought into abutting engagement with the closed end of the recess adjacent head portion 145.

To provide means for magnetizing core member 152, bobbin assembly 147 includes magnetic winding 147 wound on the bobbin between flange portions 148 and 151. This winding is connected to a pair of conductors 153 and 154 in cable 143 at connection points on flange portion 150 to facilitate energization of winding 146 by the circuitry of circuit module 141.

Bobbin assembly 146 is retained in position by an end cap 155 threaded over the end of the shank portion of housing 144. This end cap, which may be formed of a plastic material, includes an aperture through which cable 143 is snuggly received. The entire indicator module 140 may be secured in position on an enclosure wall by means of a washer 156 and nut 157 threaded over the shank portion of housing 40.

Figure 14A:
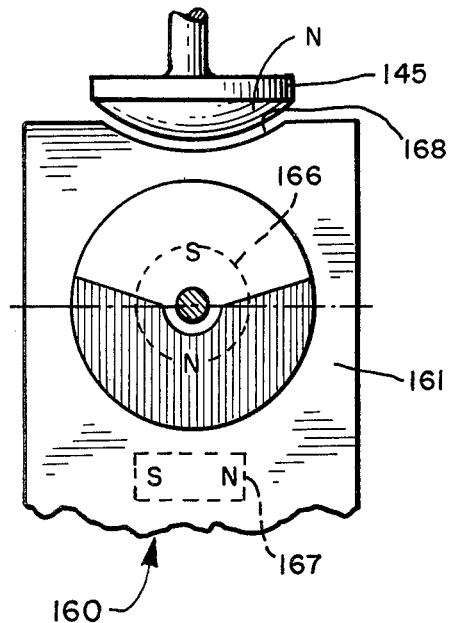
FIGS. 14a and 14b are diagrammatic views of the magnetic test tool in conjunction with the magnetic test point useful in understanding the operation of the fault indicator system of FIG. 12.
Figure 14B:
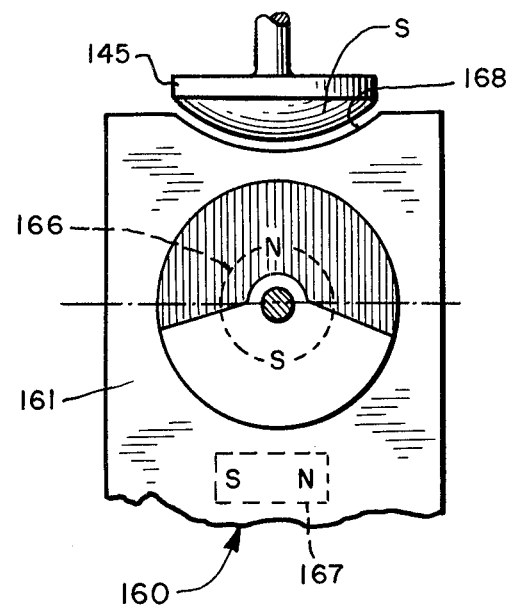

On the occurrence of a fault current in conductor 21, the magnetic test point 145 is magnetized to the magnetic polarity shown in FIG. 14b by momentary energization of winding 147 by a current in one direction. Magnetic test point 145 remains in this fault-indicating magnetic polarity until current is restored in the conductor and magnetic core 152 is remagnetized to the reset-indicating magnetic polarity shown in FIG. 14a by momentary energization of winding 147 by a current in the opposite direction.

Figure 13:
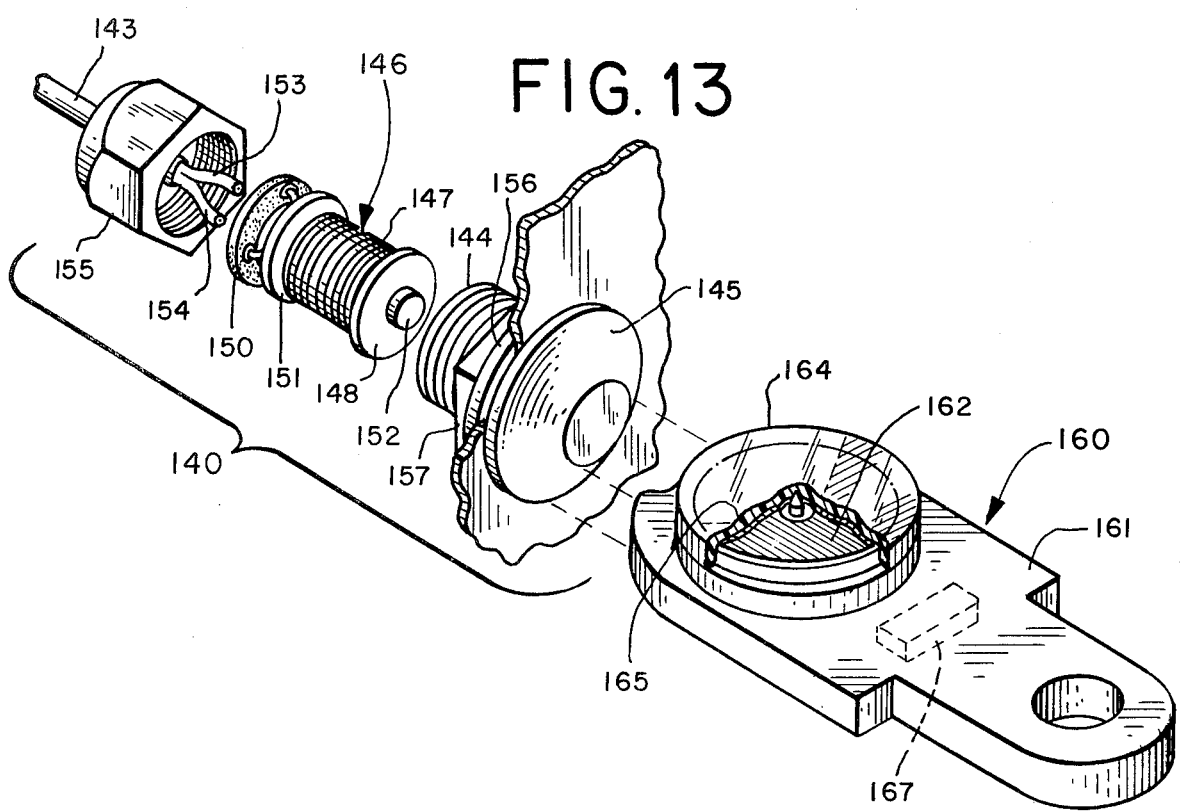
FIG. 13 is an exploded perspective view of the indicator module of FIG. 12 showing the use of a magnetic test tool therewith.

To provide a visible indication to service personnel of the magnetic sense of magnetic test point 145, and hence the status of the monitored circuit, the fault indicator system includes a hand-held circuit status indicator tool 160. As shown in FIGS. 13-14, indicator tool 160 includes a generally flat base 161 having an apertured handle portion at one end thereof. Adjacent the other end of the body, the indicator tool includes magnetic sensing means in the form of a rotatably mounted indicator disc 162. The face of disc 162 is divided into a reset-indicating white colored segment 162a and a fault-indicating red colored segment 162b. A raised transparent plastic cover 164 (FIG. 13) extends over the disc to form a sealed compartment within which the disc is free to turn. As opaque mask 165 on the inside surface of cover 164 allows only the top portion (as viewed in FIGS. 14a and 14b) of the disc to be visible to the user.

To render the position of disc 162 dependent on the magnetic polarity of magnetic test point 145, the disc includes about its pivot point an annular-shaped permanent magnet 166 having magnetic poles as shown in FIGS. 14a and 14b. In the absence of an external magnetic influence, such as that presented by magnetic test point 145, disc 162 is biased to an intermediate non-indicating position wherein both the white and red colored segments 162a and 162b are visible in generally equal proportions by means of a permanent magnet 167 mounted on base 161 along one edge of the disc. The poles of this magnet attract the poles of opposite polarity on magnet 166 with the result that the indicator rotates to and remains in the intermediate position.

When circuit status indicator tool 160 is placed adjacent to magnetic test point 145, as shown in FIGS. 14a and 14b, the stronger magnetic field provided by the magnetized core 152 is sufficient to overcome the biasing force of magnet 167. In the event that core 152 is in a reset state, the external magnetic field generated by magnet 152 rotates disc 162 to its reset-indicating position, as shown in FIG. 14a. In the event core 152 is in a fault-indicating state, the magnetic field generated by magnet 152 rotates disc 62 to its fault-indicating position, as shown in FIG. 14b. A recess 168 may be provided on the end of the circuit status indicator tool body 161 to assist in alignment of the indicator with respect to the magnetic test point.

Figure 15:
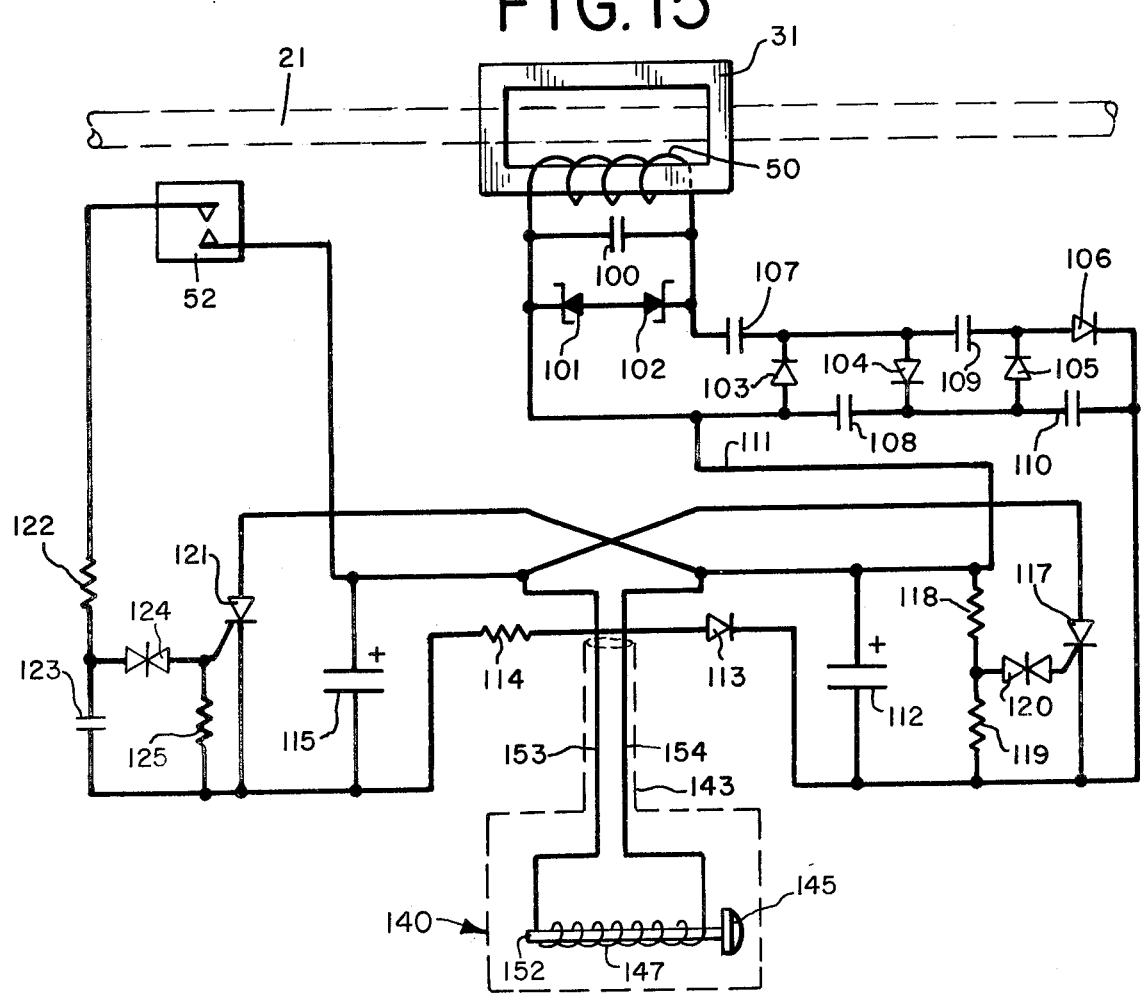
FIG. 15 is an electrical schematic diagram of the fault indicator of FIG. 12.

As shown in FIG. 15, the winding 147 of the magnetic test point-type indicator module 140 is connected to the circuitry of circuit module 141 by conductors 153 and 154 of cable 143. The circuitry of module 14, which may be identical to that previously described in connection with circuit module 22, supplies current to winding 147 in the opposite direction according to current status in the monitored conductor 21. Reference is made to the previous detailed description of circuit module 22 for the structure and operation of circuit module 141.

Once installed on a monitored electrical conductor, the magnetic core assembly of the invention provides a secure mechanical attachment as well as a close magnetic ocupling to the conductor. This is true for conductors having a wide range of outside diameters, since spring 45 biases the conductors against the third or bottom portion of the core assembly. This is illustrated in FIG. 2 by the dashed representation 170 of a conductor of smaller diameter, where it is seen that spring 45 maintains the smaller conductor secure against the bottom portion 43 of the core assembly, and in close magnetic communication with magnetic reed switch 52.

Furthermore, it will be noted that spring 45 biases coupling members 62 and 63 into engagement, notwithstanding downward force exerted on the circuit module 22 by cable 24 or otherwise. In the presence of such downward force, spring 45 stretches in opposition to the pull, which exerts further locking force on the coupling members 62 and 63.

As a variation of the rectangular structure shown for a core assembly 40, it would be possible to construct the core assembly in a D-shape with its fourth or top portion rounded. However, it will be appreciated that in this configuration spring 45 does not have as great a leverage in maintaining the coupling members in engagement, and the rounded top portion tends to bulge out under the compressive force of the spring. In contrast, the rectilinear top portion of the preferred rectangular core structure cannot be compressed, and the rectilinear side portions are effectively pivoted by the spring around the upper corners.

While the magnetic core assembly of the invention has been shown in conjunction with fault indicator systems, it will be appreciated that the core assembly can be used in other applications as well where a secure mechanical and close magnetic engagement must be maintained with a monitored conductor.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A fault indicator for indicating the occurrence of a fault current in an electrical conductor, comprising:

magnetic core means comprising a plurality of elongated strips of resilient magnetic material arranged side by side and joined at the ends thereof to form a magnetic core;

said magnetic core being formed into a closed loop having first, second, third and fourth sides, said first, second and third sides being generally rectilinear, said first side being generally opposite said second side, and said third side joining said first and second sides, said magnetic core being dimensioned to receive within said closed loop said electrical conductor;

interlocking connection means disposed along said third side for establishing a separable connection between segments of said third side, said connection being locked against lateral displacement upon said segments being urged toward axial engagement;

biasing means comprising a spring member extending between said first side and said second side for drawing said sides together whereby said segments are urged toward axial engagement, said spring member being positioned to engage the conductor opposite from said third side to urge the conductor into contact with said third side;

current-responsive means disposed along said third side of said magnetic core in magnetic communication with the conductor for providing a control effect upon the occurrence of a fault current in the conductor; and means responsive to said control effect for providing a fault indication.

2. A fault indicator as defined in claim 1 wherein said connection means are disposed at one extreme of said third side, between said first side and said second side, and said current-responsive means are disposed between said connection means and said second side.

3. A fault indicator as defined in claim 1 wherein said current-responsive means comprise a magnetic reed switch.

4. A fault indicator as defined in claim 1 wherein said circuit means require a source of excitation, and wherein a magnetic winding is provided on said third side for providing said excitation.

5. A fault indicator as defined in claim 2 wherein said circuit means require a source of excitation, and wherein a magnetic pick-up winding is disposed on said third side between said connection means and said second side for providing said excitation.

6. A fault indicator for indicating the occurrence of a fault current in an electrical conductor, comprising:

magnetic core means comprising a plurality of elongated strips of resilient magnetic material arranged side-by-side and joined at the ends thereof to form a magnetic core;

said magnetic core being formed into a closed loop of generally rectangular form having first, second, third and fourth generally rectilinear sides, said first side being opposite said second side, said third side being opposite said fourth side, and said third side joining said first and second sides, said magnetic core being dimensioned to receive within said closed loop said electrical conductor;

interlocking connection means disposed along said third side for establishing a separable connection between segments of said third side, said connection being locked against lateral displacement upon said segments being urged toward axial engagement;

biasing means comprising a spring member extending between said first side and said second side for drawing said sides together whereby said segments are urged toward axial engagement, said spring member being positioned to engage the conductor opposite from said third side to urge the conductor into contact with said third side;

current-responsive means disposed along said third side of said magnetic core in magnetic communication with the conductor for providing a control effect upon the occurrence of a fault current in the conductor;

circuit means responsive to said control effect for providing a fault indication, said circuit means being operative from an applied excitation source; and excitation means comprising a magnetic winding on said third side of said magnetic core for supplying excitation to said circuit means.

7. A fault indicator as defined in claim 6 wherein said connection means are disposed at one end of said third side, between said first side and said second side, and said current-responsive means and said magnetic winding are disposed between said connection means and said second side.

8. A magnetic core assembly as defined in claim 7 wherein said current-responsive means comprise a magnetic reed switch.

9. A fault indicator for indicating the occurrence of a fault current in an electrical conductor, comprising:

magnetic core means comprising a plurality of elongated strips of resilient magnetic material arranged side-by-side and joined at the ends thereof to form a magnetic core;

said magnetic core being formed into a closed loop having a first, second, third and fourth sides, said first, second and third sides being generally rectilinear, said first side being opposite said second side, and said third side joining said first and second sides, said magnetic core being dimensioned to receive within said closed loop said electrical conductor;

interlocking connection means disposed along said third side for establishing a separable connection between segments of said third side, said connection being locked against lateral displacement upon said segments being urged toward axial engagement;

biasing means comprising a spring member extending between said first side and said second side for drawing said sides together whereby said segments are urged toward axial engagement, said spring member being positioned to engage the conductor opposite from said third side to urge the conductor into contact with said third side;

current-responsive means disposed along said third side of said magnetic core in magnetic communication with the conductor for providing a control effect upon the occurrence of a fault current in the conductor;

circuit means operable from an applied excitation current and responsive to said control effect for providing a fault indication in response to said control effect; and excitation means comprising a magnetic winding disposed on said third side of said core for providing excitation current to said circuit means.

10. A fault indicator as defined in claim 9 wherein said connection means are disposed at one end of said third side, between said first side and said second side, and said current-responsive means are disposed between said connection means and said second side.

11. A fault indicator as defined in claim 10 wherein said current-responsive means comprise a magnetic reed switch.

12. A magnetic core assembly for installation on an electrical conductor, comprising:

a plurality of elongated strips of resilient magnetic material arranged side-by-side and joined at the ends thereof to form a magnetic core;

said magnetic core being formed into a closed loop having first, second, third and fourth sides, said first, second and third sides being generally rectilinear, said first side being generally opposite said second side, and said third side joining said first and second sides, said core being dimensioned to receive within said closed loop said electrical conductor;

interlocking connection means disposed along said third side for establishing a separable connection between segments of said third side, said connection being locked against lateral displacement upon said segments being urged toward axial engagement; and biasing means comprising a spring member extending between said first side and said second side for drawing said sides together whereby said segments are urged toward axial engagement, said spring member being positioned to engage the conductor opposite from said third side to urge the conductor into contact with said third side.

13. A magnetic core assembly as defined in claim 12 wherein said biasing means comprise a helical spring.

14. A magnetic core assembly as defined in claim 12 including current-responsive means in magnetic communication with the conductor for providing a control effect dependent on the current level in the conductor.

15. A magnetic core assembly as defined in claim 14 wherein said current-responsive means are disposed along said third side of said magnetic core.

16. A magnetic core assembly as defined in claim 12 wherein said connection means are disposed at one extreme of said third side, between said first side and said second side.

17. A magnetic core assembly as defined in claim 12 wherein said magnetic core is generally rectangular in form, and includes a generally rectilinear fourth side generally opposite said third side.

18. A magnetic core assembly as defined in claim 15 wherein said connection means are disposed at one end of said third side, between said first side and said second side, and said current-responsive means are disposed between said connection means and said second side.

19. A magnetic core assembly as defined in claim 15 wherein said current-responsive means comprise a magnetic reed switch.

20. A magnetic core assembly as defined in claim 15 wherein said current-responsive means comprise a magnetic winding.

21. A magnetic core assembly for installation on an electrical conductor, comprising:
  a plurality of elongated strips of resilient magnetic material arranged side-by-side and joined at the ends thereof to form a magnetic core;
  said magnetic core being formed into a closed loop of generally rectangular form having first, second, third and fourth sides, said first, second and third sides being generally rectilinear, said first side being generally opposite said second side, and said third side joining said first and second sides, said magnetic core being dimensioned to receive within said closed loop said electrical conductor;
  interlocking connection means disposed along said third side for establishing a separable connection between segments of said third side, said connection being locked against lateral displacement upon said segments being urged toward axial engagement; and
  biasing means comprising a spring member extending between said first side and said second side for drawing said sides together whereby said segments are urged toward axial engagement, said spring member being positioned to engage the conductor opposite from said third side to urge the conductor into contact with said third side.

22. A magnetic core assembly as defined in claim 21 wherein said biasing means comprise a helical spring.

23. A magnetic core assembly as defined in claim 21 including current-responsive means in magnetic communication with the conductor for providing a control effect dependent on the current level in the conductor.

24. A magnetic core assembly as defined in claim 23 wherein said current-responsive means are disposed along said third side of said magnetic core.

25. A magnetic core assembly as defined in claim 21 wherein said interlocking connection means are disposed at one extreme of said third side, between said first side and said second side.

26. A magnetic core assembly as defined in claim 24 wherein said connection means are disposed at one extreme of said third side, between said first side and said second side, and said current-responsive means are disposed between said connection means and said second side.

27. A magnetic core assembly as defined in claim 26 wherein said current-responsive means include a magnetic reed switch.

28. A magnetic core assembly as defined in claim 26 wherein said current-responsive means include a magnetic pick-up winding.

29. A magnetic core assembly for installation on an electrical conductor, comprising:
  a plurality of elongated strips of resilient magnetic material arranged side-by-side and joined at the ends thereof to form a magnetic core;
  said magnetic core being formed into a closed loop of generally rectangular form and having first, second, third and fourth generally rectilinear sides, said first side being generally opposite said second side, said third side being generally opposite said fourth side, and said third side joining said first and second sides, and said magnetic core being dimensioned to receive within said closed loop said electrical conductor;
  interlocking connection means disposed along said third side for establishing a separable connection between segments of said third side, said connection being locked against lateral displacement upon said segments being urged toward axial engagement;
  biasing means comprising a spring member extending between said first side and said second side for drawing said sides together whereby said segments are urged toward axial engagement, said spring member being positioned to engage the conductor opposite from said third side to urge the conductor into contact with said third side; and
  current-responsive means disposed along said third side of said magnetic core in magnetic communication with the conductor for providing a control effect dependent on the current level in the conductor.

30. A magnetic core assembly as defined in claim 29 wherein said connection means are disposed at one end of said third side, between said first side and said second side, and said current-responsive means are disposed between said connection means and said second side.

31. A magnetic core assembly as defined in claim 30 wherein said current-responsive means include a magnetic reed switch.

32. A magnetic core assembly as defined in claim 30 wherein said current-responsive means include a magnetic winding.

* * * * *

UNITED STATES PATENT AND TRADEMARK OFFICE
CERTIFICATE OF CORRECTION

PATENT NO. : 4,456,873
DATED : June 26, 1984
INVENTOR(S) : Edmund O. Schweitzer, Jr.

It is certified that error appears in the above-identified patent and that said Letters Patent are hereby corrected as shown below:

Col. 3, line 61: Change "deriving" to -- driving --.

Col. 4, line 28: Change "junction" to -- juncture --.

line 43: Change "cpore" to -- core --.

Signed and Sealed this

Third Day of September 1985

[SEAL]

Attest:

DONALD J. QUIGG

*Attesting Officer*   Acting Commissioner of Patents and Trademarks - Designate